United States Patent
Alhoussami

(10) Patent No.: US 6,438,002 B2
(45) Date of Patent: *Aug. 20, 2002

(54) ACTIVE SNUBBER CIRCUIT WITH CONTROLLABLE DV/DT

(75) Inventor: Aiman Alhoussami, Plano, TX (US)

(73) Assignee: General Electric Co., Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/495,952

(22) Filed: Feb. 2, 2000

(51) Int. Cl.[7] .............................. H02H 7/10; H02H 7/22
(52) U.S. Cl. ............................ 363/50; 363/56; 323/908
(58) Field of Search ............................ 363/50, 53, 56; 323/901, 908

(56) References Cited

U.S. PATENT DOCUMENTS

| | | | | |
|---|---|---|---|---|
| 4,275,430 A | * | 6/1981 | Seki et al. ..................... 361/91 |
| 4,849,873 A | | 7/1989 | Vanderhest .................. 363/55 |
| 4,942,508 A | * | 7/1990 | Nakamura et al. ............. 363/19 |
| 5,043,650 A | * | 8/1991 | Bhagwat et al. ............. 320/150 |
| 5,075,821 A | * | 12/1991 | McDonnal .................... 361/721 |
| 5,168,435 A | * | 12/1992 | Kobayashi et al. ........... 363/20 |
| 5,343,098 A | * | 8/1994 | Miyasaka ..................... 327/310 |
| 5,414,613 A | | 5/1995 | Chen ............................ 363/52 |
| 5,450,308 A | * | 9/1995 | Tai ............................... 363/57 |
| 5,483,192 A | * | 1/1996 | Tai ............................... 327/440 |
| 5,796,599 A | * | 8/1998 | Raonic et al. ................. 363/57 |
| 5,814,965 A | | 9/1998 | Randall ....................... 318/701 |
| 5,828,559 A | | 10/1998 | Chen ............................ 363/56 |
| 5,841,268 A | | 11/1998 | Mednik ....................... 323/222 |
| 5,874,826 A | * | 2/1999 | Chen et al. .................... 363/53 |
| 5,880,943 A | * | 3/1999 | Yokoyama .................... 363/56 |
| 5,896,284 A | * | 4/1999 | Murasato et al. ........... 363/124 |
| 5,995,385 A | * | 11/1999 | Shimamura ................... 363/56 |

* cited by examiner

Primary Examiner—Bao Q. Vu
(74) Attorney, Agent, or Firm—Karl Vick; Kevin Duncan; Hunton & Williams

(57) ABSTRACT

An active snubber circuit having a controllable dV/dt. The circuit includes a power device and surface mount components including a resistor having a value selectable to control the dV/dt. The use of surface mount components achieves a low profile, small size circuit that can advantageously be used to eliminate noise generated by contact arcing, to dissipate arc energy while clamping to a predetermined voltage value, and in power conversion applications to provide a desirable dV/dt, among other applications.

22 Claims, 5 Drawing Sheets

CONTACTS STATUS : FROM CLOSED TO OPEN.

CONTACTS STATUS : FROM CLOSED TO OPEN.

ACTIVE SNUBBER CIRCUIT WITH CONTROLLABLE DV/DT

BACKGROUND OF THE INVENTION

The present invention relates generally to snubber circuits. More particularly, the present invention relates to active snubber circuits, such as those used to reduce noise generated by contact arcing.

Snubber circuits are used to reduce switching stress, such as current surges, voltage spikes and oscillations, and switching losses in an electric switching element. Snubber circuits operate to limit the rate of change of voltage across the switching element when the switch is turned off, thereby reducing turn-off power dissipation losses within the switch. A typical snubber circuit includes an absorbing circuit and a resetting circuit. A simple example of a absorbing circuit is a inductor or capacitor in series with the switching element. A wide variety of resetting circuits are known.

Passive snubbers use non-dissipative passive resetting elements. Typical passive snubbers have turn-off absorbing circuits which are not connected directly across the switching element. This type of absorbing circuit connection is generally not desirable in high-power, high-frequency applications, due to size limitations and parasitic inductance.

Active snubber circuits typically include two or more switching elements in the absorbing or resetting circuit. In most snubber circuits, a full load current is transferred to the absorbing circuit when the main switching element is turned off. It is not generally perceived as desirable to have the snubber switching element carry the full load current, since its purpose is to relieve the stress on the main switching element.

U.S. Pat. No. 5,841,268 discloses a multi-resonant soft switching snubber network for a DC-to-DC converter. The multi-resonant network includes an auxiliary switch connected to transfer energy from a parasitic capacitance of the power switching device into a resonant inductor and to achieve a zero voltage turn on of the switching device. An additional resonant path is included in the snubber network to achieve a zero voltage turn off.

U.S. Pat. No. 4,849,873 discloses an active snubber for an inverter which reduces turn off losses in the electronic switch of the inverter. The snubber includes a resistor and capacitor connected in series with each other and in parallel with the load on the power inverter and parallel, inverse connected silicon controlled rectifiers in parallel with the resistor for selectively shorting the resistor.

U.S. Pat. No. 5,814,965 to Randall discloses a reduced noise controller for a switched reluctance machine. One or more capacitor smoothing circuits, positioned in a converter for the switched reluctance machine, are used to smooth voltage transitions across a phase winding.

U.S. Pat. No. 5,828,559 to Chen discloses a soft switching device for an electric power switching application. The device includes a soft switching active snubber having a capacitor, a rectifier, and a soft switching active reset circuit for actively resetting the capacitor.

U.S. Pat. No. 5,414,613 to Chen discloses a soft switching active snubber for a power conversion circuit operated in a discontinuous mode. The circuit includes a snubber capacitor, an isolation diode, and an active reset circuit. The snubber capacitor is connected to the output of the isolation diode, both of which are connected across a main switch of the power conversion circuit. The active reset circuit is responsive to a reset signal for active resetting of the snubber capacitor within the normal boost cycle of the power conversion circuit.

It would be desirable for an active snubber circuit to be smaller than conventional snubber circuits, to offer a controllable dV/dt, to offer a relatively wide load current range, and be resistant to vibration.

SUMMARY OF THE INVENTION

The present invention overcomes the above-noted problems, and achieves additional advantages, by providing for an active snubber circuit that is small in size, has a controllable dV/dt feature, is rugged, and is resistant to vibration damage. According to exemplary embodiments, an active snubber circuit includes a power device such as a field effect transistor, a resistor and a diode connected between the gate of the power device and one terminal, a capacitor connected between the gate of the power device and the other terminal. The components are preferably implemented using surface mount technology, resulting in a low profile device, and the resistance of the surface mount resistor can be varied to adjust the dV/dt of the snubber circuit.

Alternative embodiments allow the snubber circuit to be used to eliminate noise generated by contact arcing, or in power conversion applications such as for motor insulation protection, or as a clamping circuit which dissipates arc energy in the power device while clamping the voltage at a specified level, or as a snubber with active dV/dt control.

BRIEF DESCRIPTION OF THE DRAWINGS

The features and advantages of the present invention can be understood more fully by reading the following Detailed Description in conjunction with the accompanying drawings, in which.

DETAILED DESCRIPTION OF THE INVENTION

Figure 1:
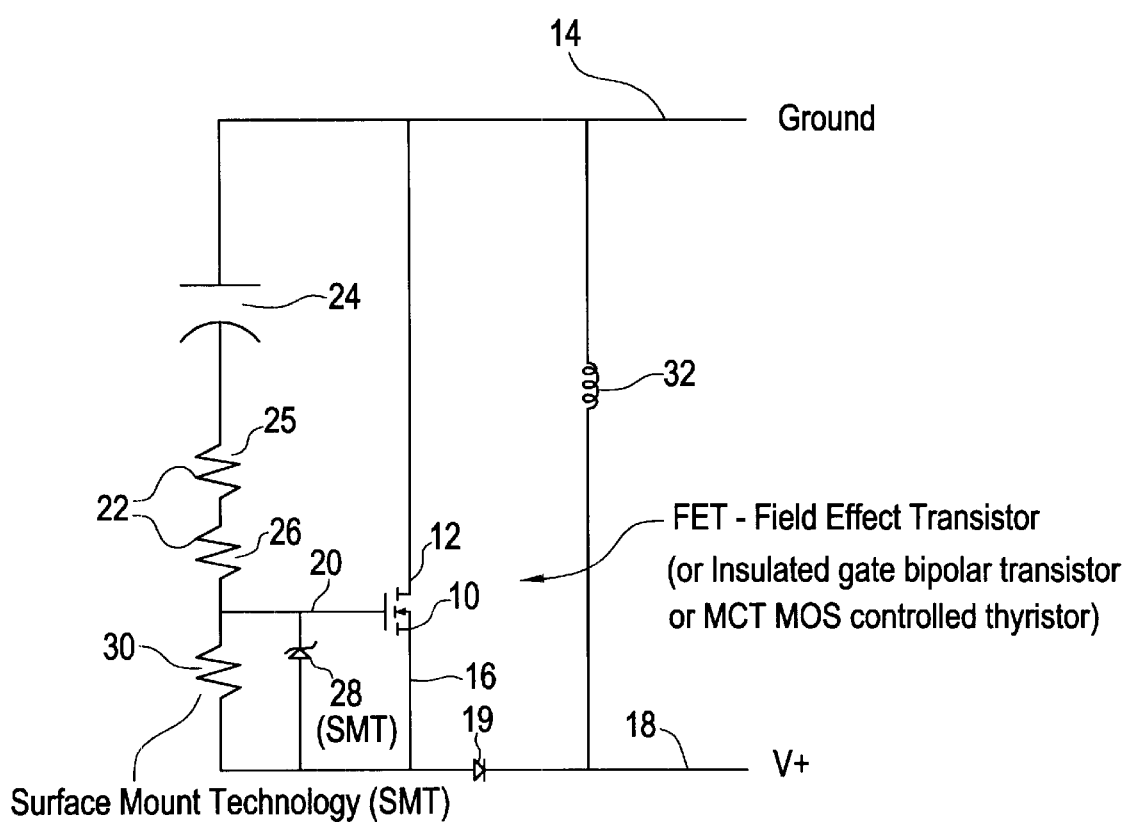
FIG. 1 is a first embodiment of a snubber circuit in accordance with the present invention.

Referring now to FIG. 1, a first snubber circuit according to the present invention is shown. In this example, the snubber circuit includes a power device 10, which can be implemented by a field effect transistor, which has a first terminal 12 connected to a ground terminal 14 and a second terminal 16 connected to a positive voltage terminal 18 through a forward connected diode 19. The power device 10 further has a gate 20. A resistance 22 and a capacitance 24 are connected in series between the gate 20 and the first terminal 12. The resistance 22 is, in this example, embodied by first and second resistors 25 and 26. A zener diode 28 is connected between the second terminal 16 and the gate 20, and a resistor 30 is connected in parallel with the zener diode 28. All of the components (e.g., resistors, capacitor, and diodes) are preferably implemented using surface mount technology (SMT) to improve the profile of the device. In this example, the snubber circuit has an inductive load 32.

The power device 10 can be implemented by a field effect transistor (FET) as shown in FIG. 1, or can alternatively be implemented by an insulated gate bipolar transistor (IGBT), a MOS Controlled Thyristor (MCT), or other suitable component. It should be noted that the use of an IGBT or MCT requires the use of an additional diode in antiparallel with the switch, to allow for bidirectional switching.

The snubber circuit of FIG. 1 behaves as a capacitor, yet requires a capacitance that is over 1000 times smaller than a passive snubber with comparable performance, and the circuit can be mounted in a smaller area due to its low profile. The capacitor's voltage rating (24) is selected to match the voltage rating of the power device 10. One advantageous aspect of the circuit of FIG. 1 is that the dV/dt response of the circuit is variable based on the selection of the resistance value for resistor 30. It should be noted that the resistor can be embodied by a variable resistor component to provide further flexibility to the design of the snubber circuit. Further, the snubber circuit of FIG. 1 has a generally wider load current range than a passive circuit having comparable performance.

In one exemplary embodiment, the circuit of FIG. 1 has the following component values: capacitance 24 is a 0.001 $\mu$F capacitor, diode resistor 30 is a 10 k resistor, and resistances 25 and 26 are 1 k resistances. The resistances are all rated for 0.1 watts, with 1% tolerance. The capacitance 24 is rated for 1000 volts, with 5% tolerance, and the zener diode is rated for 7.5 volts. It will of course be appreciated that the component values can be varied as needed for specific applications.

Figure 2:
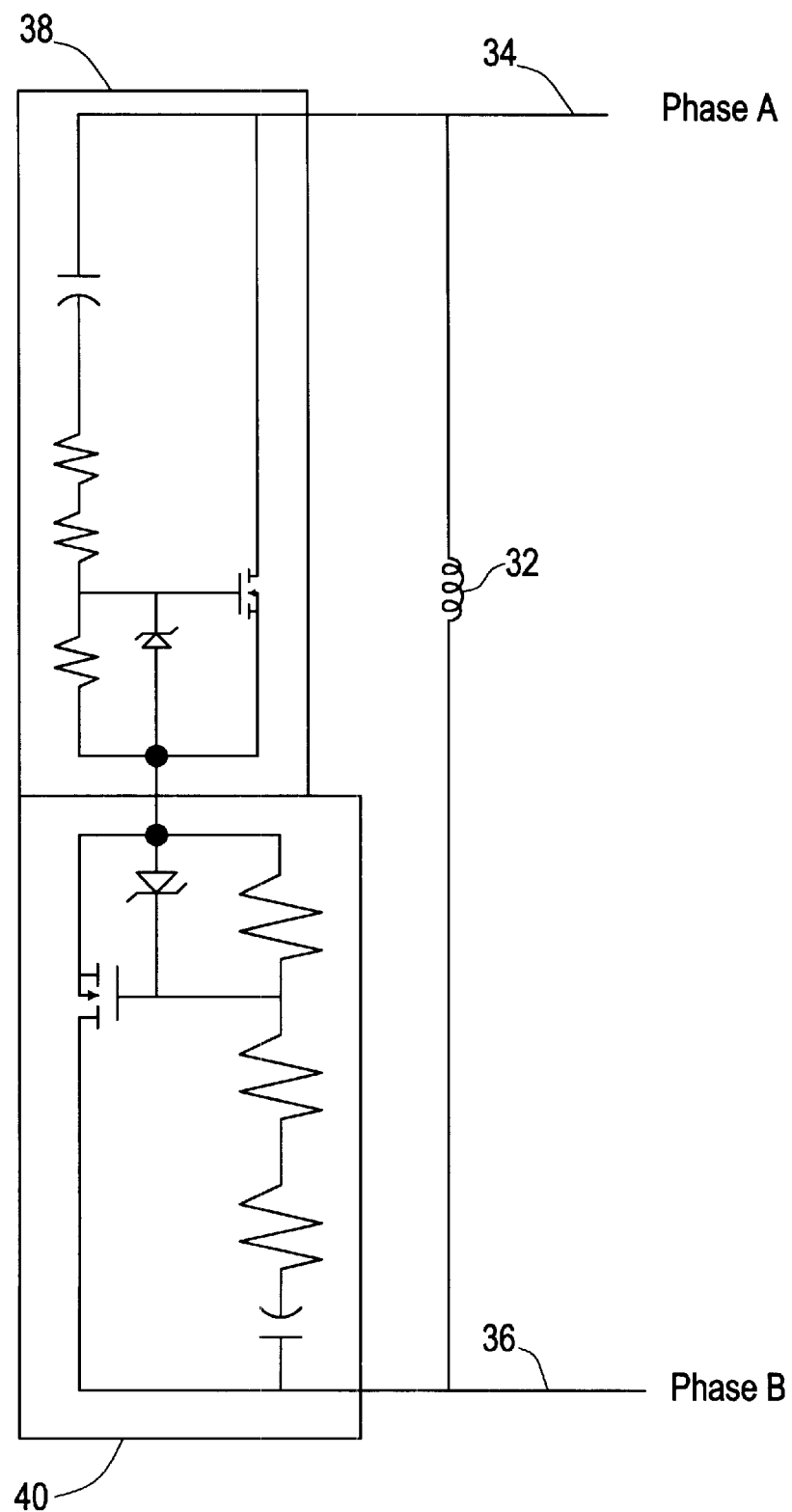
FIG. 2 is a second embodiment of a snubber circuit in accordance with the present invention.

Referring now to FIG. 2, a second embodiment of a snubber circuit according to the present invention is shown. In this example, a load 32 is connected between lines 34 and 36 carrying first and second phase signals, respectively, in an alternating current (AC) application. First and second snubber circuits 38 and 40 are connected in series with each other, and in parallel with the load 32. Both the first and second snubber circuits 38 and 40 are substantially the same as the circuit shown in FIG. 1.

Figure 3:
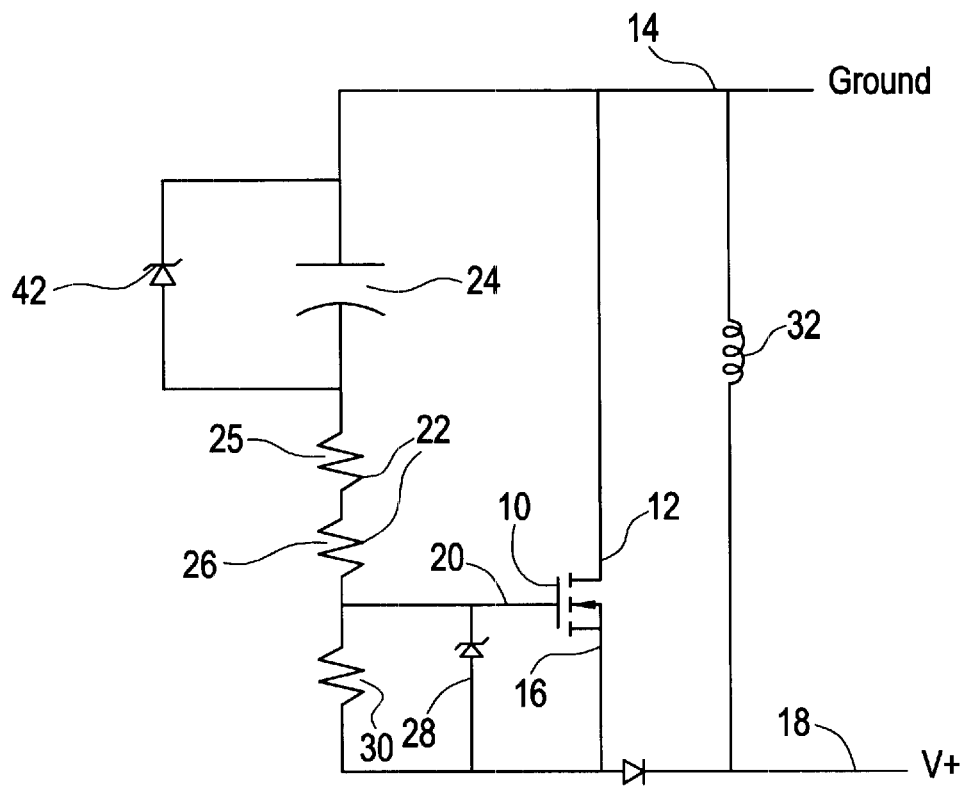
FIG. 3 is a third embodiment of a snubber circuit in accordance with the present invention.

Referring now to FIG. 3, a third embodiment of a snubber circuit according to the present invention is shown. This example shows a clamped snubber circuit in a DC application. In this example, a single snubber circuit 38 is substantially the same as in FIGS. 1–2, but with the addition of a clamping zener diode 42, which is shown as a single diode, but which can be embodied as one or more diodes in series. The circuit of FIG. 3 advantageously can totally dissipate arc energy in the power device while accurately clamping the voltage at a desired level. Thermal considerations may require a larger power device 10; a larger power device can prevent intrinsic breakdown of the power device in the event that the rating of the power device is exceeded.

Figure 4:
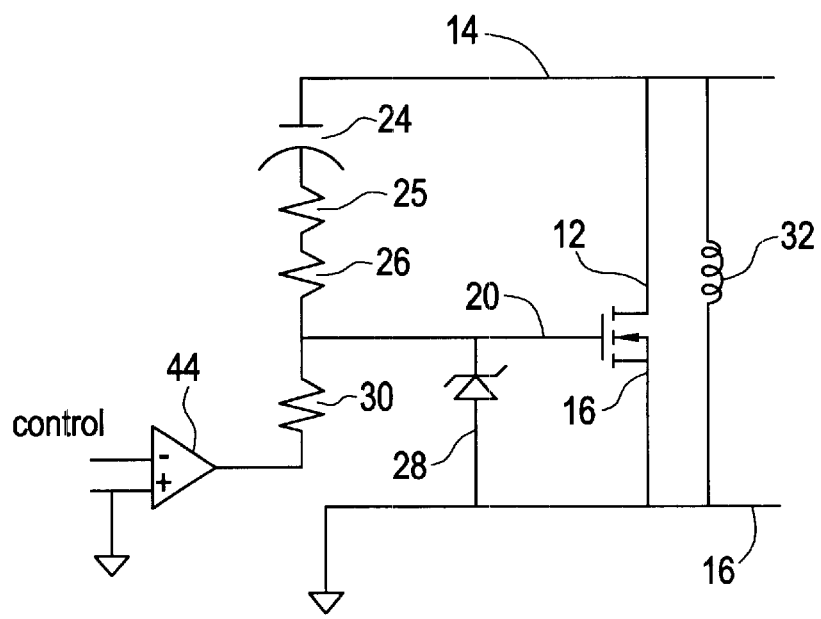
FIG. 4 is a fourth embodiment of a snubber circuit in accordance with the present invention.

Referring now to FIG. 4, a fourth embodiment of a snubber circuit according to the present invention is shown. The snubber circuit 38 in this example is substantially similar to that shown in the previous examples, but with the addition of an operational amplifier 44 having an output connected to the resistor 30, having an inverting input connected to a control signal source, and having a non inverting input connected to a common line. Further, the input to the diode 28 is also connected to the common line. The circuit of FIG. 4 can be actively controlled, via the control signal provided to the non-inverting input of the amplifier 44, to vary the voltage response (dV/dt).

The snubber circuits described in the above examples can be connected across an inductive load (as shown) or across the device or contacts switching the load. In a typical 500 volt or 1000 volt application at 0–10 amps, the circuit can be easily implemented with off the shelf components in surface mount packages. The circuit is relatively simple yet provides powerful performance characteristics, and the circuit can be scaled in voltage and current. For high current applications, a power module may be required as the power device 10. Other modifications will be readily apparent to those of ordinary skill in the art.

Figure 5:
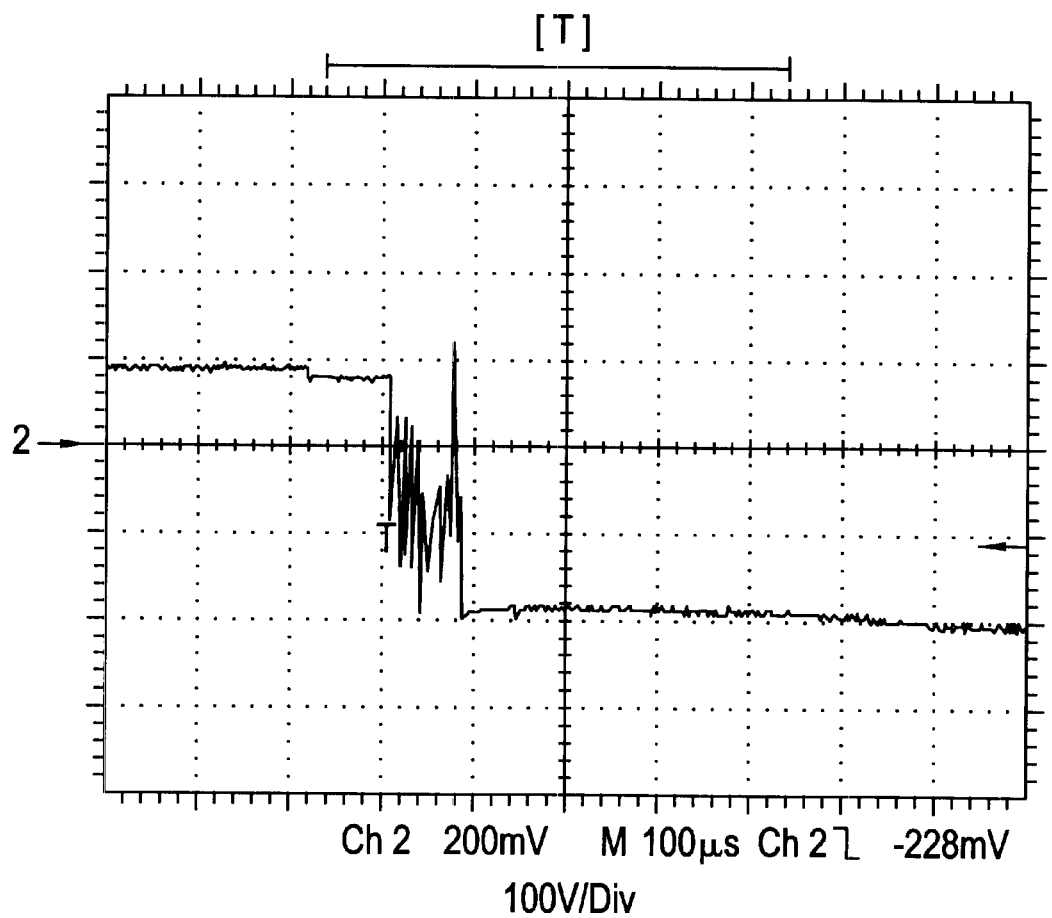
FIG. 5 is a waveform showing the effects of a switched load without a snubber circuit.
Figure 5:
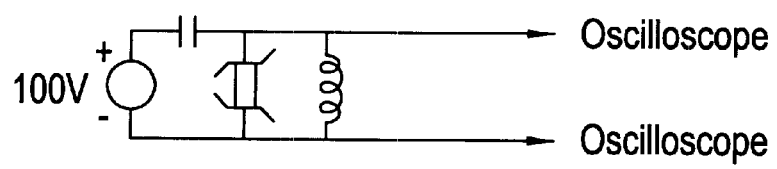
Figure 6:
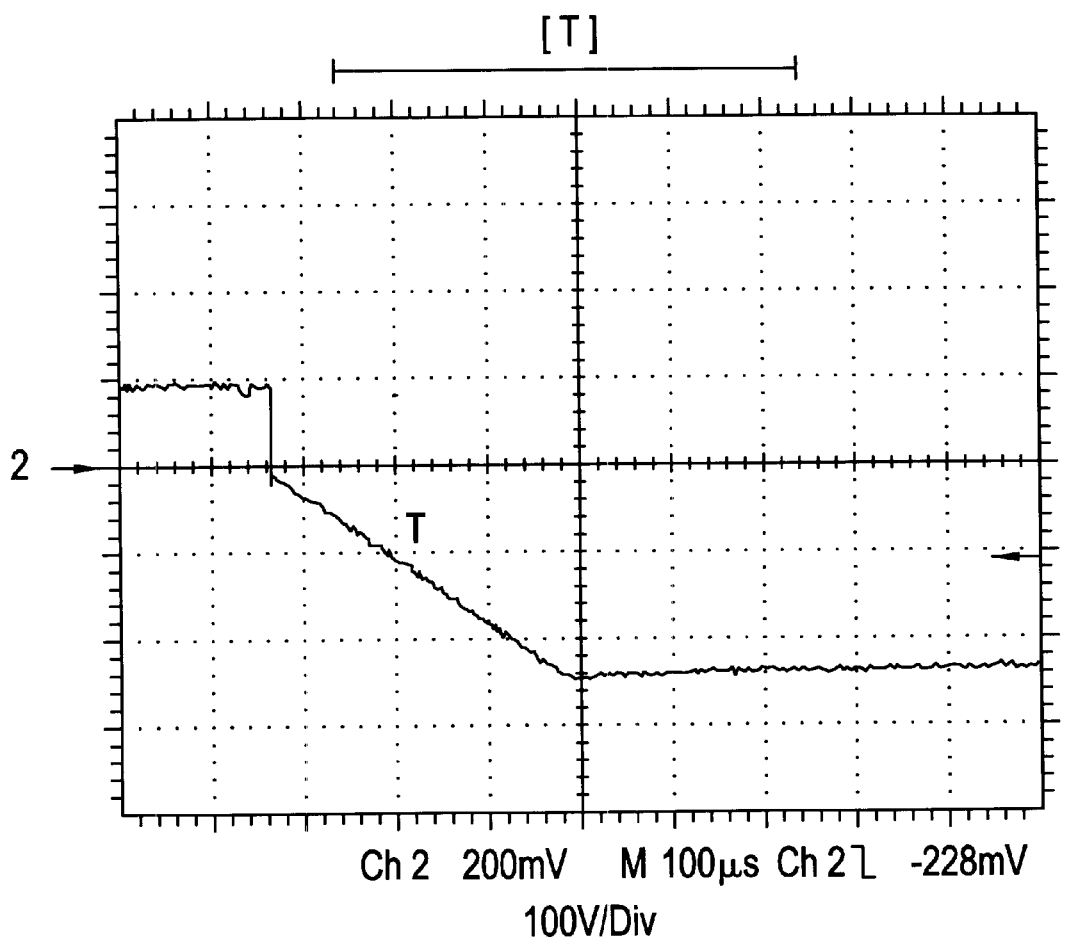
FIG. 6 is a waveform diagram showing the effects for a switched load with an active snubber circuit according to the present invention.

Referring now to FIG. 5, a waveform showing the voltage response for switching on a load (from a closed switch position to an open switch position) powered by a 100 volt source without a snubber circuit. It can be seen that the voltage response is erratic. In contrast, FIG. 6 shows a waveform of the voltage response for the same operation (switching contacts from closed to open) of the same circuit where a snubber circuit according to the present invention is connected in parallel with the inductive load. In this configuration, the voltage response is significantly smoother and more controlled.

A capacitor across diode 28 might be necessary in large circuit board applications to combat the effects of layout capacitances. A typical value of 4.7 nF is suitable.

While the foregoing description includes many details and specificities, these are for purposes of explanation only, and are not to be construed as limitations of the invention. Numerous modifications to the described details will be readily apparent to those skilled in the art. Such modifications will not depart from the spirit and scope of the invention, as defined by the following claims and their legal equivalents.

What is claimed is:

1. An active snubber circuit comprising:
   a power device having first and second terminals, and having a gate terminal;
   at least one resistor connected between the gate terminal and the first terminal;
   at least one capacitor serially connected to the at least one resistor between the gate terminal and the first terminal; and
   at least one diode connected between the gate terminal and the second terminal;
   control means, having an output, an inverting input, and a non-inverting input, wherein the inverting input is connected to a control signal source, and the non-inverting input is connected to a common line; and
   wherein the active snubber circuit can be controlled via the control signal source.

2. The circuit of claim 1, wherein the power device is a field-effect transistor.

3. The circuit of claim 1, wherein the power device is one of an insulated gate bipolar transistor and a MOS Controlled Thyristor (MCT).

4. The circuit of claim 3, wherein each power device includes one additional antiparallel diode.

5. The circuit of claim 1, wherein at least one diode is a surface mount technology (SMT) zener diode.

6. The circuit of claim 1, wherein the resistor is a surface mount technology (SMT) resistor having a resistance value which determines a dV/dt ratio of the circuit.

7. The circuit of claim 1, wherein the circuit is connected across an inductive load.

8. The circuit of claim l, wherein the circuit is connected across contacts switching a load.

9. The circuit of claim 1, wherein the circuit has an operating range substantially equivalent to an operating range of the power device.

10. The circuit of claim 1, wherein the power device, resistor, capacitor, and diode are surface mount components.

11. The circuit of claim 1, wherein the circuit is connected to a power conversion circuit.

12. A method for providing an active snubber circuit and reducing switching stress in an electric switching element comprising first, second and gate terminals, the method comprising:

providing a current resistive element connected between the gate terminal and the first terminal;

providing a capacitive element connected in series with the current resistive element between the gate terminal and the first terminal; and providing at least one diode connected between the gate terminal and the second terminal; and wherein the current resistive element and the capacitive element operate to provide a snubbing action in the circuit in order to provide a substantially smoother and controlled voltage response of the switching circuit.

13. The method of claim 12, wherein the electric switching element is a field-effect transistor.

14. The method of claim 12, wherein the electric switching element is one of an insulated gate bipolar transistor and a MOS Controlled Thyristor (MCT).

15. The method of claim 12, wherein each switching element includes an additional antiparallel diode.

16. The method of claim 12, further comprising a diode connected between the gate terminal and the second terminal.

17. The method of claim 12, wherein the diode is a surface is a surface mount technology (SMT) zener diode.

18. The method of claim 12, wherein the current resistive element is a surface mount technology (SMT) resistor having a resistance value which determines a dV/dt ratio of the circuit.

19. The method of claim 12, wherein the circuit has an operating range substantially equivalent to an operating range of the power device.

20. The method of claim 12, wherein the switching element, resistive element, and capacitive element are all surface mount components.

21. An active snubber circuit comprising:

a power device having first and second terminals, and having a gate terminal;

at least one resistor connected between the gate terminal and the first terminal;

at least one capacitor serially connected to the at least one resistor between the gate terminal and the first terminal;

at least one zener diode connected between the gate terminal and the second terminal;

a diode resistor connected in parallel with the at least one zener diode between the gate terminal and the second terminal, the diode resistor being a variable resistor component; and control means, having an output, an inverting input, and a non-inverting input, wherein the inverting input is connected to a control signal source, and the non-inverting input is connected to a common line; and wherein the active snubber circuit can be controlled via the control signal source; and wherein the at least one resistor, the at least one capacitor, the at least one zener diode, and the diode resistor are all surface mount components.

22. A method for providing an active snubber circuit and reducing switching stress in an electric switching element comprising first, second and gate terminals, the method comprising:

providing a current resistive element connected between the gate terminal and the first terminal;

providing a capacitive element connected in series with the current resistive element between the gate terminal and the first terminal;

providing at least one diode connected between the gate terminal and the second terminal;

providing a diode resistor connected in parallel with the at least one diode between the gate terminal and the second terminal; and wherein the current resistive element and the capacitive element operate to provide a snubbing action in the circuit in order to provide a substantially smoother and controlled voltage response of the switching circuit.

* * * * *